US012029015B2

(12) United States Patent
Shaw et al.

(10) Patent No.: US 12,029,015 B2
(45) Date of Patent: Jul. 2, 2024

(54) CONTROL SYSTEMS FOR AIR-ASSISTED AND LIQUID-COOLED ENCLOSURES

(71) Applicant: Microsoft Technology Licensing, LLC, Redmond, WA (US)

(72) Inventors: Mark Edward Shaw, Carnation, WA (US); Husam Atallah Alissa, Redmond, WA (US); Brandon Rubenstein, Issaquah, WA (US); Robert Jason Lankston, II, Woodinville, WA (US); Christian Belady, Mercer Island, WA (US); Bharath Ramakrishnan, Bellevue, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 388 days.

(21) Appl. No.: 17/132,600

(22) Filed: Dec. 23, 2020

(65) Prior Publication Data
US 2022/0201902 A1    Jun. 23, 2022

(51) Int. Cl.
*H05K 7/20*    (2006.01)
(52) U.S. Cl.
CPC ..... *H05K 7/20781* (2013.01); *H05K 7/20209* (2013.01); *H05K 7/20263* (2013.01); *H05K 7/20272* (2013.01); *H05K 7/20281* (2013.01)
(58) Field of Classification Search
CPC ............ H05K 7/2059; H05K 7/20654; H05K 7/20745; H05K 7/2079; H05K 7/20009; H05K 7/20136; H05K 7/20145; H05K 7/202; H05K 7/20218; H05K 7/20272; H05K 7/20554; H05K 7/20836
See application file for complete search history.

(56) References Cited

U.S. PATENT DOCUMENTS

| | | | |
|---|---|---|---|
| 9,043,035 B2 | 5/2015 | Chainer et al. | |
| 9,091,496 B2 | 7/2015 | Imwalle et al. | |
| 9,273,906 B2 | 3/2016 | Goth et al. | |
| 9,386,727 B2 | 7/2016 | Barringer et al. | |

(Continued)

FOREIGN PATENT DOCUMENTS

WO    WO-2017222968 A1 * 12/2017    ............. B60K 11/02

OTHER PUBLICATIONS

Fernandes, John Edward, "Minimizing Power Consumption At Module, Server And Rack-Levels Within A Data Center Through Design And Energy-Efficient Operation Of Dynamic Cooling Solutions", In Thesis of The University of Texas at Arlington, May 2015, 144 Pages.

*Primary Examiner* — Frantz F Jules
*Assistant Examiner* — Jason N Thompson
(74) *Attorney, Agent, or Firm* — RAY QUINNEY & NEBEKER P.C.; Paul N. Taylor

(57) ABSTRACT

Techniques for controlling cooling of electronic components in computing facilities are disclosed herein. In one embodiment, a method includes detecting a pressure drop of a coolant flowing across multiple servers in an enclosure between the inlet and outlet manifolds and a supply temperature of the coolant at the inlet manifold. The method further includes automatically adjust operations of the pump to maintain the calculated pressure drop at or near a pressure-drop setpoint while automatically adjusting operations of the air mover to maintain the supply temperature at or near a temperature setpoint.

18 Claims, 5 Drawing Sheets

(56) References Cited

U.S. PATENT DOCUMENTS

| | | | |
|---|---|---|---|
| 10,238,011 B1 | 3/2019 | Cui et al. | |
| 10,653,044 B2 | 5/2020 | Chainer et al. | |
| 2007/0050644 A1* | 3/2007 | Merkin | G06F 1/206 713/300 |
| 2010/0263855 A1* | 10/2010 | Arimilli | G05D 23/1931 165/288 |
| 2011/0100618 A1* | 5/2011 | Carlson | H05K 7/2079 165/104.33 |
| 2012/0290135 A1* | 11/2012 | Bentivegna | G05D 23/1934 700/276 |
| 2013/0133873 A1* | 5/2013 | Campbell | H05K 7/20281 165/287 |
| 2013/0340995 A1* | 12/2013 | David | F28F 27/00 165/287 |
| 2014/0190681 A1* | 7/2014 | Chainer | H05K 7/20836 165/289 |
| 2014/0361092 A1* | 12/2014 | Iizuka | H05K 7/20836 236/49.3 |
| 2016/0120059 A1* | 4/2016 | Shedd | F28D 21/00 165/244 |
| 2017/0219219 A1 | 8/2017 | Miller et al. | |
| 2019/0182988 A1* | 6/2019 | Lunsman | H05K 7/20281 |

\* cited by examiner

CONTROL SYSTEMS FOR AIR-ASSISTED AND LIQUID-COOLED ENCLOSURES

BACKGROUND

Datacenters and other large-scale computing facilities can contain thousands and even millions of servers interconnected by routers, switches, bridges, load balancers, firewalls, and other network devices. The servers and network devices are typically housed in buildings, rooms, basements, racks, cabinets, containers, or other types of physical enclosures. The individual servers can host virtual machines, containers, or other virtualized components cooperating with one another to execute applications in order to provide cloud services to users via a computer network such as the Internet.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

During operation, servers and other electronic components are continuously cooled in order to maintain proper functionalities in computing facilities. One cooling technique involves providing cooling air to an enclosure containing electronic components. The cooling air then flows past the operating electronic components in the enclosure to remove heat and then exhaust as hot air from the enclosure to a return air plenum. The hot air carrying the absorbed heat can then dissipate the absorbed heat to a heat sink before circulating back to the enclosure. Such a cooling technique is typically referred to as air cooling.

Air cooling, however, may be inadequate to sufficiently cool high-power electronic components because heat transfer coefficients between the cooling air and electronic components may be too low to accommodate high rates of heat generation. To improve heat transfer rates, liquid cooling may be implemented in the enclosure to remove heat from the electronic components. For instance, a cooling system in an enclosure can provide a coolant (e.g., cooling water) to a jacket surrounding high-power electronic components via an inlet manifold. The coolant can then flow through the jacket to remove generated heat from the electronic components before being collected at an outlet manifold. In certain implementations, the enclosure can include a radiator to dissipate the absorbed heat from the cooing fluid to cooling air flowing through the enclosure before the cooling air is exhausted to the return air plenum. Such a technique is often referred to as air-assisted and liquid-cooled cooling. In other implementations, the coolant may be collected from the enclosure to dissipate the absorbed heat to a heat sink external to the enclosure, such as to a cooling tower or chiller.

In certain computing facilities, implementations of the air-assisted and liquid-cooled cooling involves directly coupling operations of the cooling system in the enclosure to a configuration of electronic components in an enclosure. For example, the cooling system can include a coolant source (e.g., a reservoir coupled to one or more pumps) that is calibrated to provide the coolant at a set pressures and/or a set flowrate based on measured pressure drops of the coolant in the enclosure. In another example, an air mover in the enclosure can also be calibrated to operate at a certain speed and/or air flow rate in order to accommodate an amount of heat removed by the coolant from the electronic components by maintaining suitable temperatures of the coolant at the inlet manifold.

The foregoing direct coupling of the cooling system to the configuration of the electronic components in the enclosure can be inefficient to accommodate configuration changes in the enclosure. For instance, when one or more electronic components are added, removed, or replaced by other electronic components in the enclosure, flow and/or heat generation characteristics in the enclosure can change. As a result, the cooling system may need to be recalibrated to accommodate different pressure drops and/or heat generation rates of the electronic components in the enclosure. Such recalibration is labor intensive, costly, and introduce downtime to the computing facilities.

Several embodiments of the disclosed technology can address at least some of the foregoing drawbacks by implementing a control system configured to automatically tune the cooling system in an air-assisted and liquid-cooled enclosure. In certain implementations, the control system can include a controller (e.g., a Programmable Logic Controller or PLC) communicatively coupled to various pressure, flow, and temperature sensors in the cooling system (collectively referred to as "sensors") configured to measure various process variables in the enclosure. For example, the various sensors can be configured to measure and provide readings of a supply pressure of the coolant at the inlet manifold, a return pressure of the coolant at the outlet manifold, a supply temperature of the coolant to the electronic components, and a return temperature of the coolant to the cooling system. In other embodiments, the various sensors can also be configured to measure a flow rate of the coolant provided to the electronic components, operating temperatures of the electronic components, and/or other suitable types of process variables.

During operation, the controller can be configured to receive readings of the various process variables and automatically adjust operations of the coolant source and the air mover. For example, the controller can be configured to receive the supply and return pressures of the coolant and derive a pressure drop as a difference between the supply and return pressures. The controller can then be configured to compare the pressure drop to a pressure-drop setpoint and adjust a pump speed of a pump in the coolant source configured to provide the coolant to the electronic components. For instance, when the pressure drop is above the pressure setpoint, the controller can be configured to increase the pump speed. When the pressure drop is below the pressure setpoint, the controller can be configured to decrease the pump speed. The adjustment can be proportional, derivative, and/or integral with respect to the difference between the derived pressure drop and the pressure-drop setpoint. As such, the pressure drop can be maintained at or near (e.g., within 10% of) the pressure-drop setpoint.

During operation, the controller can also be configured to adjust operations of the air mover based on readings of various process variables. In one example, the controller can be configured to compare the supply temperature of the coolant at the inlet manifold to a supply temperature setpoint. When the supply temperature is above the supply temperature setpoint, the controller can be configured to increase cooling air flow by, for instance, increasing an operating speed of the air mover and/or turning on additional air mover(s) in the enclosure. When the supply temperature is below the supply temperature setpoint, the controller can be configured to decrease cooling air flow by, for instance, decreasing the operating speed of the air mover and/or turning off additional air mover(s). The adjustment can be proportional, derivative, and/or integral with respect to the supply temperature of the coolant. As such, the supply temperature can be maintained at or near (e.g., within 10% of) the temperature setpoint. In other examples, the controller can also be configured to adjust the operation of the air mover based on a return temperature of the coolant at the outlet manifold, a temperature difference between the return and supply temperatures of the coolant, a flow rate of the coolant, and/or other suitable process variables.

In certain implementations, a user (e.g., a technician or engineer) can provide an input to the controller regarding a configuration change in the enclosure. Such input can be provided via a remote terminal unit, a touchscreen, or other suitable man-machine interfaces. Upon receiving the input, the controller can be configured to calculate an expected change in the pressure drop of the coolant as a result of the configuration change. For instance, when a new electronic component is added to the enclosure, the controller can be configured to access a database record having data indicating a nominal, rated, or other suitable types of pressure drop incurred by the electronic component. The controller can then be configured to derive a change to the pump speed based on the expected change in the pressure drop and a pump capacity profile (e.g., a pump curve) of the pump of the coolant source. The controller can then be configured to instruct the pump in the coolant source to implement the derived change in pump speed prior or concurrently to monitoring the pressure drop and supply temperature of the coolant. In other implementations, the controller can also be configured to calculate a change in the speed of air mover based on the expected change in the pump capacity (i.e., a flow rate increase of the coolant) and/or a heat generating rate of the added electronic component and instruct the air mover to implement the change in a feed-forward manner.

Several embodiments of the disclosed technology can thus automatically tune the cooling system to accommodate configuration changes in electronic components in the enclosure. For example, when an electronic component is added to the enclosure, the added electronic component can result in increased pressure drop of the coolant across the inlet and outlet manifolds. In response, the controller can increase the pump speed in order to maintain the pressure-drop setpoint. The added electronic component can also generate additional heat and thus result in an increased supply temperature of the coolant from the coolant source when cooling air flow remains constant. In response, the controller can increase the speed of the air mover and/or turn on additional air mover(s) in order to provide additional cooing air to remove heat from the coolant collected from the outlet manifold. As such, when electronic components are added, removed, or replaced, the control system can automatically adjust various components in the cooling system to accommodate the resulting flow and heat generating characteristics in the enclosure. Thus, manual calibration or recalibration of the cooing system may be avoided.

DETAILED DESCRIPTION

Figure 1:
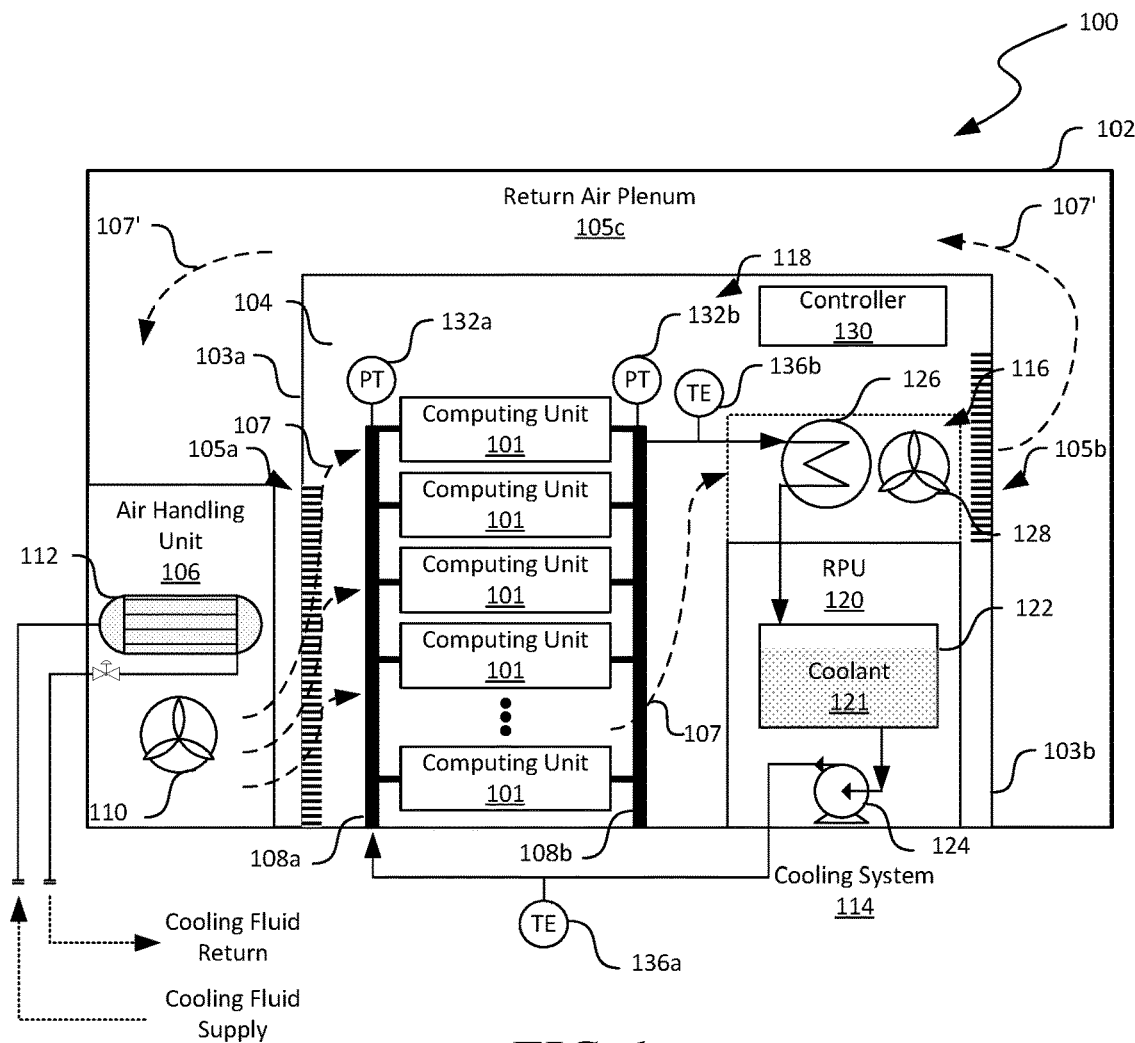
FIG. 1 is a schematic diagram of a computing facility implementing automatic tuning of an air-assisted and liquid-cooled cooling system in accordance with embodiments of the disclosed technology.

Certain embodiments of systems, devices, components, modules, routines, and processes for providing automatic tuning of an air-assisted and liquid-cooled system in enclosures housing electronic components of a computing facility are described below. In the following description, specific details of components are included to provide a thorough understanding of certain embodiments of the disclosed technology. A person skilled in the relevant art can also understand that the disclosed technology may have additional embodiments or may be practiced without several of the details of the embodiments described below with reference to FIGS. 1-5.

As used herein, a "computing facility" generally refers to a computing system having a plurality of network devices that interconnect a plurality of servers to one another or to external networks (e.g., the Internet) as well as buildings, rooms, containers, racks, cabinets, or other suitable types of enclosures that house the servers, the network devices, or other suitable types of electronic components. The term "network device" generally refers to a physical network device, examples of which include routers, switches, hubs, bridges, load balancers, security gateways, or firewalls. A "computing unit" generally refers to a server or other suitable types of computing device having various electronic components configured to implement, for instance, one or more virtual machines or other suitable virtualized components. Examples of such electronic components include central processing units, graphical processing units, high performance computing chips, etc.

Also used herein, a "heating, ventilation, and air conditioning" or "HVAC" system generally refers to a system having components configured to provide a suitable operating environment to electronic components housed in enclosures in a computing facility. In one example, an HVAC system can include one or more air movers configured to force air through a heat exchanger circulated with a cooling fluid to produce cooling air for entering an enclosure housing servers or other types of electronic devices. In another example, an HVAC system can also include a chiller or other suitable refrigeration equipment configured to provide chilled air or chilled water to the enclosure housing the electronic components. In further examples, an HVAC system can also include cooling towers, moisture absorbers, and/or other suitable equipment.

In addition, an "air mover" generally refers to an apparatus configured to generate an air flow. Examples of air movers can include fans, blowers, or compressors having multiple blades configured to push, pull, or otherwise impart movement to air in order to generate an air flow. An air mover can include a single stage or multi-stage fan, blower, or compressor. One example fan suitable for generating an air flow is an adjustable propeller fan provided by Aerovent of Minneapolis, Minnesota. Other examples of air movers can include centrifugal fans/blowers, tube-axial fans, vane-axial fans, or other suitable devices.

In certain computing facilities, operations of an air-assisted and liquid-cooled cooing system are directly coupled to a configuration of electronic components in an enclosure. Such direction coupling, however, can be inefficient and costly because any changes in the electronic components may require recalibration of the cooling system. Several embodiments of the disclosed technology can address at least some of the foregoing drawbacks of direct coupling by implementing a control system configured to automatically tune the cooling system to accommodate any changes in the electronic components, as described below with reference to FIGS. 1-5.

FIG. 1 is a schematic diagram of a computing facility 100 implementing automatic tuning of an air-assisted and liquid-cooled cooling system in accordance with embodiments of the disclosed technology. As shown in FIG. 1, the computing facility 100 can include a structure 102 (e.g., a building) with an air handling unit 106 and an enclosure 104 holding multiple computing units 101. One enclosure 104 and one air handling unit 106 are shown in FIG. 1 for illustration purposes though the computing facility 100 can accommodate any suitable numbers of enclosures 104 or air handling units 106. In other embodiments, the computing facility 100 can also include other suitable electrical/mechanical components in similar or different arrangements.

As shown in FIG. 1, the computing facility 100 can include multiple computing units 104 housed in the enclosure 104 and connected to one another by a computer network (not shown for brevity). The computer network can include a wired medium (e.g., twisted pair, coaxial, untwisted pair, or optic fiber), a wireless medium (e.g., terrestrial microwave, cellular systems, WI-FI, wireless LANs, Bluetooth, infrared, near field communication, ultra-wide band, or free space optics), or a combination of wired and wireless media. The computer network may operate according to Ethernet, token ring, asynchronous transfer mode, and/or other suitable protocols. In further embodiments, the computer network 108 can also include routers, switches, modems, and/or other suitable computing/communications components in any suitable arrangements.

The computing units 101 can individually include electronic components configured to implement one or more computing applications, network communications, input/output capabilities, and/or other suitable functionalities. In certain embodiments, the computing units 101 can include printed circuit boards carrying central processing units, graphical processing units, memories, persistent storage devices, and/or other suitable electronic components. In other embodiments, the computing units 101 can include electronic components configured as routers, network switches, analog/digital input/output modules, modems, and/or other suitable computing devices. FIG. 1 shows five computing units 104 in the enclosure 104 for illustration purposes. In other embodiments, any other suitable number of computing units 101 may be in housed in the enclosure 104.

As shown in FIG. 1, the structure 102 can include multiple air spaces configured to circulate cooling air to the enclosures 104. For example, the structure 102 can include a cool air plenum 105a corresponding to the enclosure 104. The cool air plenum 105a is configured to receive cooling air 107 from the air handling unit 106 via, for instance, an input port 103a. The structure 102 can also include a hot air plenum 105b that is configured to receive exhaust air 107' from the enclosures 104 after the cooling air 107 is exhausted from the enclosure 104. The structure 102 can further include a return air plenum 105c that is connected to the hot air plenum 105b via an outlet port 103b. The return air plenum 105c can be configured to route the exhaust air 107' back to the air handling units 106, which in turn remove heat from the exhaust air 107' to a cooling fluid (e.g., cooling water, chilled water, etc.) before recirculating the cooling air 107 to the cool air plenum 105a via the inlet port 103a.

The air handling units 106 can include suitable heat exchanging, air moving, moisture controlling, and/or other suitable types of devices. In the illustrated example, the air handling unit 106 includes a heat exchanger 112 and an air mover 110. The air mover 110 can be configured to force the exhaust air 107' from the return air plenum 105c to be in thermal contact with the cooling fluid from a source 150 (shown in FIGS. 3A-3C) of the cooling fluid. As such, the cooling fluid can absorb heat from the exhaust air 107' to reduce a temperature of the exhaust air 107' to, for instance, 25° C. before being recirculated into the cool air plenum 105a as cooling air 107. In other examples, the air handling units 106 can also include multiple air movers arranged in an array, air louvers, air dampers, temperature sensors, and/or other suitable devices.

As shown in FIG. 1, the enclosure 104 can also include an air-assisted and liquid-cooled cooling system 114 that is configured to remove at least a portion of the heat generated by the computing units 101 during operation. Though the cooling system 114 is shown as being integrated into the enclosure 104 in FIG. 1, in other implementations, the cooling system 114 can also be centralized for multiple enclosures 104, for multiple computing facilities, or arranged in other suitable manners.

As shown in FIG. 1, the cooling system 114 includes an inlet manifold 108a to the computing units 101, an outlet manifold 108b from the computing units 101, and a radiator 116 operatively coupled to a reservoir and pump unit or RPT 120. The RPT 120 can include a coolant reservoir 122 configured to contain a coolant 121 (e.g., cooling water) and operatively coupled to a pump 124. The coolant reservoir 122 can include a container constructed with a suitable material (e.g., aluminum) to contain the coolant 121. The pump 124 can include a centrifugal, screw, piston, or other suitable types of pump. In certain embodiments, the RPU 120 can also include a pump speed drive 127 (shown in FIG. 2A) configured to control a pump speed of the pump 124. In other embodiments, the RPU 120 can also include one or more additional pumps 124 (shown in FIGS. 2B and 2C) arranged in parallel, in series, or in other suitable manner with respect to the pump 124.

The inlet manifold 108a can be configured to receive the coolant 121 from the RPU 120 and distribute the received coolant 121 to the individual computing units 101. The coolant 121 can then flow through various electronic components on the individual computing units 101 via, for instance, a jacket to remove heat from the electronic components during operation. The coolant 121 can then be collected at the outlet manifold 108b before being directed to the radiator 116. The inlet and outlet manifolds 108a and 108b can each include a pipe, tubing, or other suitable types of conduit having suitable numbers of branches corresponding to the individual computing units 101.

The radiator 116 can be configured to dissipate heat from the coolant 121 collected at the outlet manifold 108b. In the illustrated embodiment, the radiator 116 includes a heat exchanger 126 and an air mover 128 operatively coupled to one another. The heat exchanger 126 is configured to allow heat transfer from the coolant 121 to the cooling air 107 flowing through the enclosure 104. The heat exchanger 126 can include a tube-and-sheet, plate-and-frame, or other suitable types of heat exchanger. The air mover 128 is configured to force the cooling air 107 to flow past the heat exchanger 126. In certain embodiments, the radiator 116 can also include a fan speed drive 129 (shown in FIG. 2A). In other embodiments, the radiator 116 can also include one or more additional air movers 128 (shown in FIGS. 2B and 2C).

In operation, cooling air 107 flows from the air handling unit 106 through the inlet port 103a into the enclosure 104. The cooling air 107 can then flow past the computing units 101. Meantime, the pump 124 of the RPU 120 provides the coolant 121 at a pressure and flow rate to the inlet manifold 108a. The inlet manifold 108a can then distribute the coolant 121 to the individual computing units 101 to remove heat generated by electronic components on the computing units 101. The coolant 121 with the absorbed heat can then be collected in the outlet manifold 108b before entering the heat exchanger 126 of the radiator 116. The air mover 128 of the radiator 116 can force at least a portion of the cooling air 107 from the computing units 101 to flow across the heat exchanger 126 to dissipate the absorbed heat from the coolant 121 to the cooling air 107 before the exhaust air 107' is exhausted through the outlet port 103b.

During operation, certain components of the cooling system 114 may be tuned to accommodate flow and heat generation characteristics of the computing units 101. For example, the pump 124 may be tuned with a pump speed such that a suitable flow rate of the coolant 121 is achieved from the inlet manifold 108a to the outlet manifold 108b. In another example, the air mover 128 may be tuned with a fan speed such that the cooling air 107 flowing across the heat exchanger 126 is adequate to remove the absorbed heat in the coolant 121 returning from the outlet manifold 108b. As discussed above, in certain computing facilities, such tuning is performed manually by directly coupling the operations of the pump 124 and/or the air mover 128 to the configuration of the computing units 101. Such direct coupling can be inefficient, labor intensive, and costly.

Several embodiments of the disclosed technology can address at least some of the foregoing drawbacks by implementing a control system 118 that is configured to automatically tune the cooling system 114 to accommodate any changes in the computing units 101. As shown in FIG. 1, the control system 118 can include a controller 130 (e.g., a PLC) operatively coupled to multiple process variable sensors. For example, the sensors can include a supply pressure sensor 132a at the inlet manifold 108a, a return pressure sensor 132b at the outlet manifold 108b, a supply temperature sensor 136a at the inlet manifold 108a, and a return temperature sensor 136b at the outlet manifold 108b. The pressure sensors 136a and 136b can each include a pressure transmitter. The temperature sensors 138a and 138b can each include a thermocouple, a Resistance Temperature Detector ("RTD"), or other suitable types of temperature sensor. In other embodiments, the sensors can also include a flow sensor configured to measure a flow rate of the coolant 121, one or more pressure sensors configured to measure a pressure drop of the cooling air 107 in the enclosure 104 and/or across the heat exchanger 126, or other suitable sensors. With readings from the various sensors, the controller 130 can be configured to automatically tune the cooling system 114 to accommodate the computing units 101, as described below with reference to FIGS. 2A-2C.

Figure 2A:
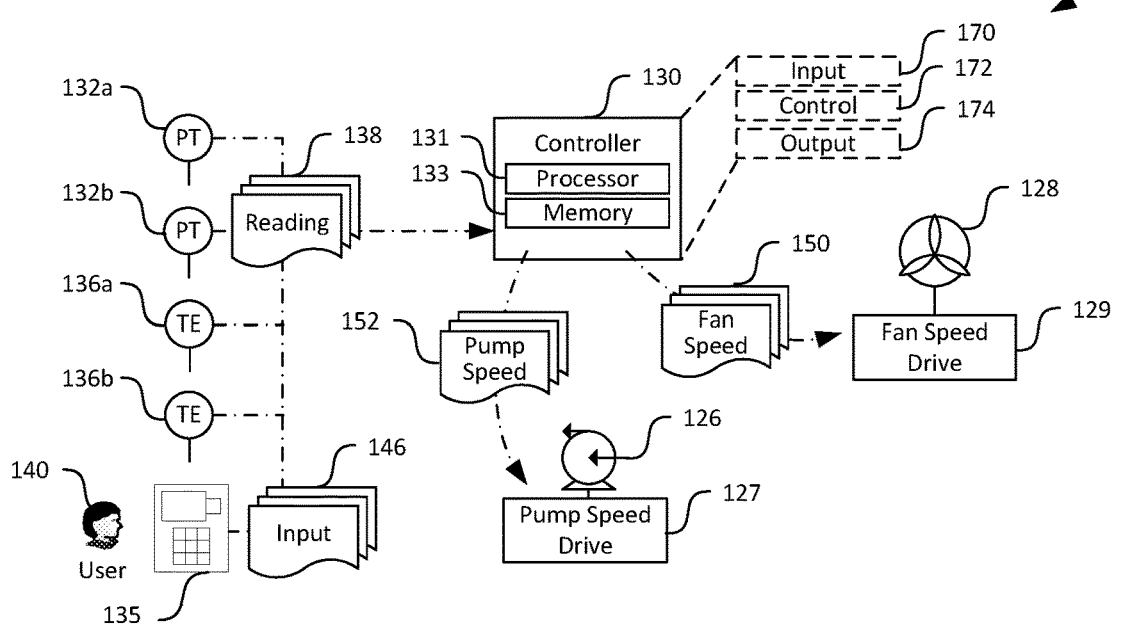
FIGS. 2A-2C are schematic diagrams of a control system during certain operations suitable for the computing facility of FIG. 1 in accordance with additional embodiments of the disclosed technology.

As shown in FIG. 2A, the control system 118 can include a controller 130 operatively coupled to the pressure and temperature sensors 132a, 132b, 136a, and 136b. The controller 130 can include a processor 131, a memory 133, and an input/output component 135 operatively coupled to one another. The processor 131 can include a microprocessor, a field-programmable gate array, and/or other suitable logic devices. The memory 133 can include volatile and/or non-volatile media (e.g., ROM; RAM, magnetic disk storage media; optical storage media; flash memory devices, and/or other suitable storage media) and/or other types of computer-readable storage media configured to store data received from, as well as instructions for, the processor 131 (e.g., instructions for performing the methods discussed below with reference to FIGS. 4A and 4B). The input/output component 135 can include a display, a touch screen, a keyboard, a mouse, a printer, and/or other suitable types of input/output devices configured to accept input from and provide output to a user 140 and/or an automated software controller (not shown).

Also shown in FIG. 2A, the control system 118 can also include a pump speed drive 127 operatively coupled to the pump 126 and a fan speed drive 129 operatively coupled to the air mover 128 of the radiator 116. Though speed drives 127 and 129 are shown in FIG. 2A as devices configured to adjust operations of the pump 126 and the air mover 128, in other embodiments, the pump 126 and/or the air mover 128 can be operated at a constant speed while the cooing system 114 (FIG. 1) includes additional pumps and/or air movers that can be turned on/off in order to adjust a flow rate of the coolant 121 (FIG. 1) and/or the cooling air 107 (FIG. 1), respectively, as described in more detail below with reference to FIGS. 2B and 2C.

The processor 131 of the controller 130 can execute suitable instructions from the memory 133 to provide various software modules such as an input module 170, a control module 172, and an output module 174. The input module 170 can be configured to receive readings 138 from the various sensors 132a, 132b, 136a, and 136b and convert the readings 138 into suitable engineering units. For example, input module 170 can be configured to convert the reading 138 from a 0-5 Volt or 4-20 mA signal into process variables of pressure in pounds per square inch, atmosphere, millimeter mercury, or other suitable units. The input module 170 can also be configured to filter, smooth, or perform other suitable operations on the received readings 138 before providing the process variables to the control module 172 for further processing.

The control module 172 can include various calculation and control routines. For example, the control module 172 can include a calculation routine configured to calculate a difference between the readings 138 of the supply pressure and return pressure of the coolant 121 from the corresponding pressure sensors 132a and 132b. The control module 172 can also include a proportional, proportional-and-integral, or proportional-integral-and-differential control routine. The control routine can be configured to generate a control variable based on an input process variable and a setpoint. For example, as shown in FIG. 2A, the control module 172 can be configured to receive the supply and return pressures of the coolant 121 and derive a pressure drop as a difference between the supply and return pressures. The control module 172 can then be configured to compare the pressure drop to a pressure-drop setpoint and adjust a pump speed of the pump 126 by providing a control variable to the output module 174. The output module 174 can be configured to convert the control variable to a suitable signal (e.g., a 0-5 Volt signal) corresponding to a pump speed 152 to the pump speed drive 127. As such, when the pressure drop is above the pressure setpoint, the control module 172 can be configured to increase the pump speed 152. When the pressure drop is below the pressure setpoint, the control module 172 can be configured to decrease the pump speed 152.

During operation, the control module 172 can also be configured to adjust operations of the air mover 128 based on readings of various process variables from the temperature sensors 136a and 136b. In one example, the control module 172 can be configured to compare the supply temperature of the coolant 121 at the inlet manifold 108a to a supply temperature setpoint. When the supply temperature is above the supply temperature setpoint, the control module 172 can be configured to increase cooling air flow by, for instance, increasing an operating speed of the air mover 128 by adjusting signal representing a fan speed 150 to the fan speed drive 129. When the supply temperature is below the supply temperature setpoint, the control module 172 can be configured to decrease cooling air flow by, for instance, decreasing the operating speed of the air mover 128. In other examples, the control module 172 can also be configured to adjust the operation of the air mover based on a return temperature of the coolant 121 at the outlet manifold 108b, a temperature difference between the return and supply temperatures of the coolant 121, a flow rate of the coolant 121, and/or other suitable process variables.

In certain implementations, a user 140 (e.g., a technician or engineer) can provide an input 146 to the controller 130 via the input/output component 135 regarding a configuration change in the enclosure 104. Such input can be provided via a remote terminal unit, a touchscreen, or other suitable man-machine interfaces. Upon receiving the input, the controller can be configured to calculate an expected change in the pressure drop of the coolant 121 as a result of the configuration change. For instance, when a new computing unit 101 is added to the enclosure, the controller 130 can be configured to access a database record (not shown) having data indicating a nominal, rated, or other suitable types of pressure drop incurred by the computing unit 101. The controller 130 can then be configured to derive a change to the pump speed 152 based on the expected change in the pressure drop and a pump capacity profile (e.g., a pump curve) of the pump 126. The controller 130 can then be configured to instruct the pump 126 to implement the derived change in pump speed 152 prior or concurrently to monitoring the pressure drop of the coolant 121 between the inlet and outlet manifolds 108a and 108b. In other implementations, the controller 130 can also be configured to calculate a change in the speed of air mover 128 based on the expected change in the pump capacity (i.e., a flow rate increase of the coolant) and/or a heat generating rate of the added computing unit 101 and instruct the air mover 128 to implement the change in a feed-forward manner.

Figure 2B:
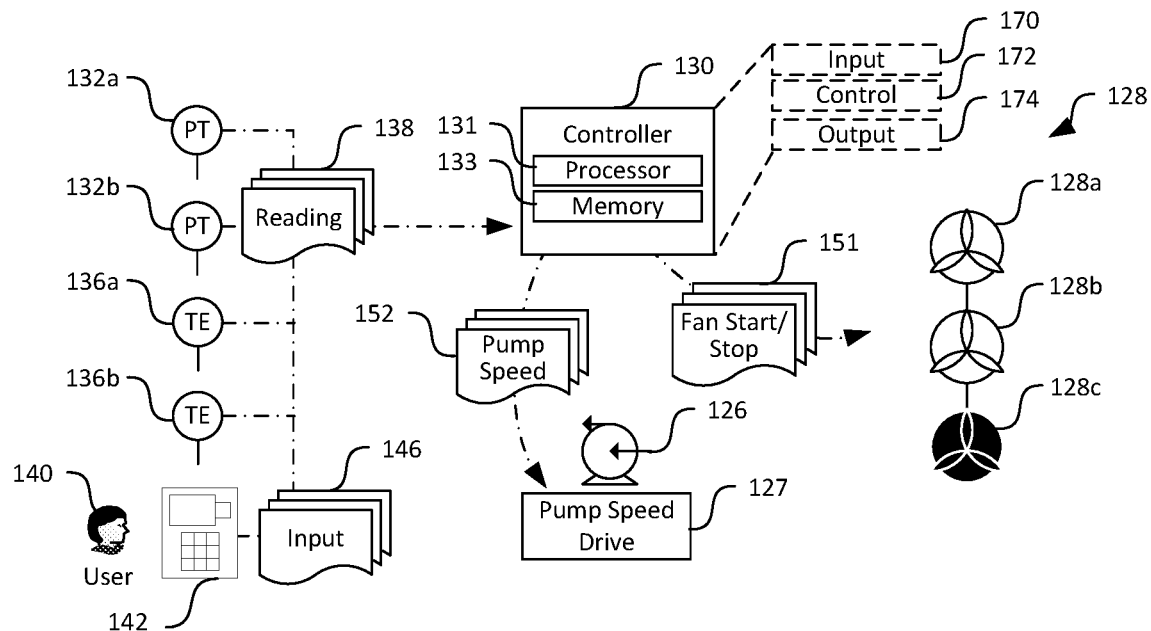

FIG. 2B illustrates another operating scenario for the cooling system 114 in FIG. 1. As shown in FIG. 2B, the air mover 128 includes an assembly having multiple air movers 128a, 128b, and 128c that can be individually turned on/off. As such, when the supply temperature is above the supply temperature setpoint, the control module 172 can be configured to increase cooling air flow by, for instance, transmitting a fan start/stop signal 151 to the air mover 128 to turn on/off one or more air movers 128a-128c. In the illustrated example, the first and second air movers 128a and 128b are turned on while the third air mover 128c remains off. When the supply temperature is below the supply temperature setpoint, the control module 172 can be configured to decrease cooling air flow by, for instance, one or more of the air movers 128a-128c.

Figure 2C:
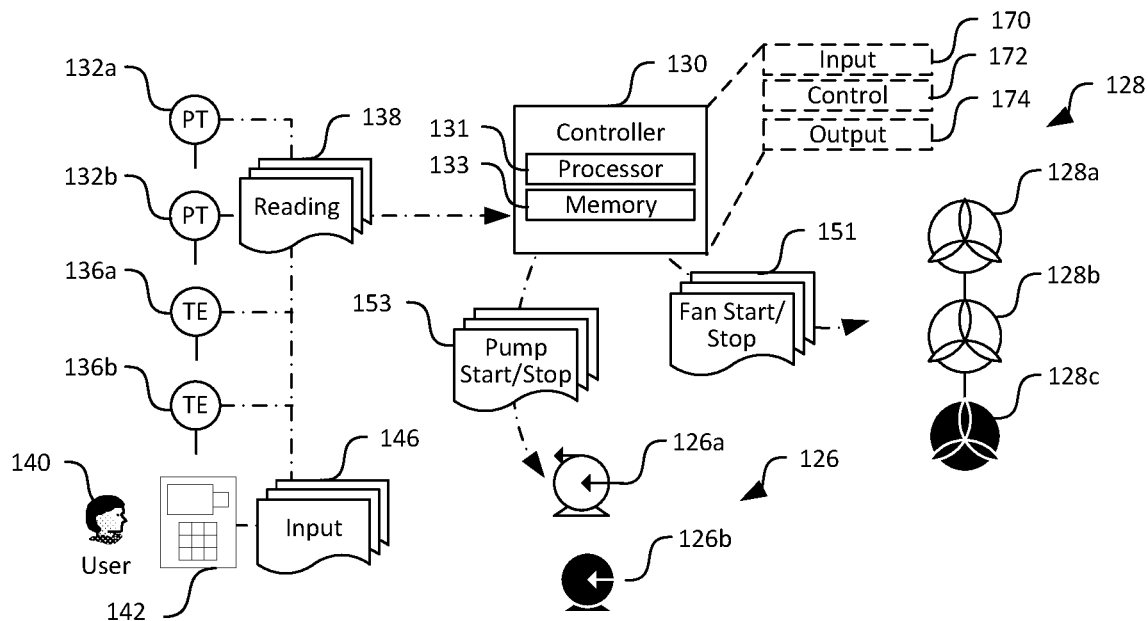

FIG. 2C illustrates yet another operating scenario for the cooling system 114 in FIG. 1. As shown in FIG. 2C, the RPU 120 includes multiple pumps 126a and 126b that are arranged in parallel and can be individually turned on/off. As such, when the pressure drop is above the pressure setpoint, the control module 172 can be configured to turned on one or more additional pump 126a or 126b. When the pressure drop is below the pressure setpoint, the control module 172 can be configured to turned off one or more additional pump 126a or 126b. In further embodiments, the individual air movers 128 and/or pumps 126 can also individually be coupled to a speed drive configured to adjust an operating speed of the air movers 128 and/or pumps 126. Additional air movers 128 and/or pumps 126 can be turned on/off when existing air movers 128 and/or pumps 126 have reached a high or low speed threshold. For instance, an additional air mover 128 can be turned on when an existing air mover is already operating at 90%, 95%, or 100% speed. In another example, an air mover 128 can be turned off when the air mover 128 is operating at a speed lower than 10%.

Figure 3A:
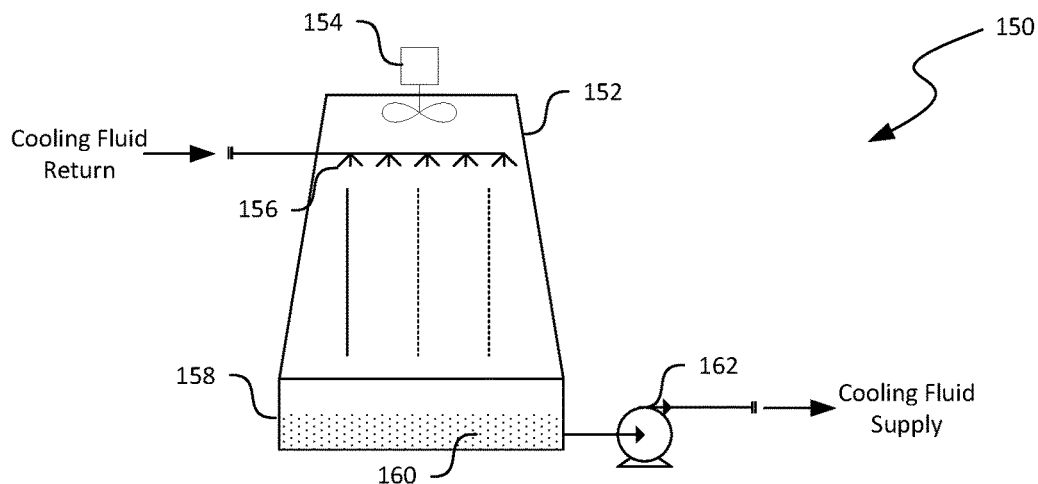
FIGS. 3A-3C are schematic diagrams illustrating certain components and configurations of a source of coolant suitable for the computing facility in FIG. 1 in accordance with embodiments of the disclosed technology.
Figure 3B:
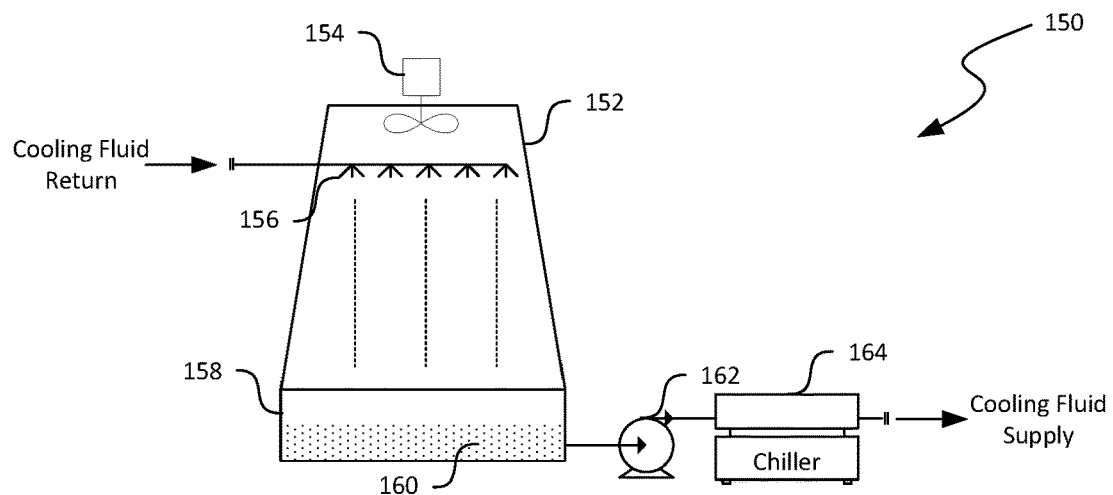
Figure 3C:
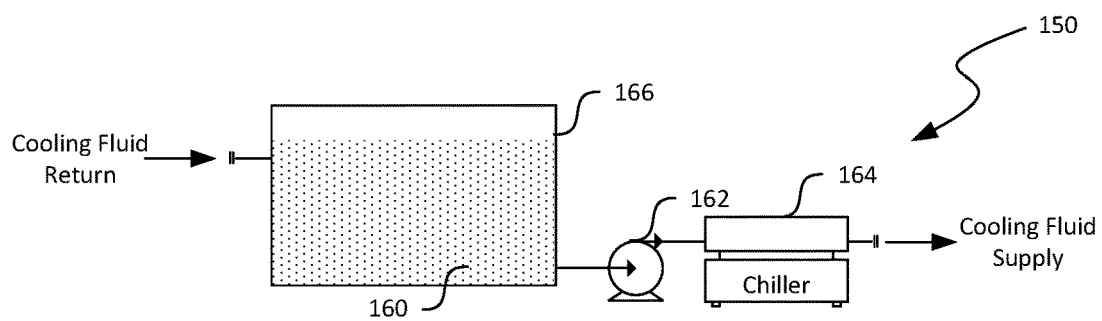

FIGS. 3A-3C are schematic diagrams illustrating certain components and configurations of a source 150 of cooling fluid suitable for the computing facility in FIG. 1 in accordance with embodiments of the disclosed technology. As shown in FIG. 3A, the source 150 can include a cooling tower 152 operatively coupled to a circulation pump 162 as an adiabatic cooling unit. The cooling tower 152 can include a spray manifold 156 configured to receive cooling fluid return from, for instance, the air handling units 106 in FIG. 1 and a fan 154 that is configured to force air up toward top of the cooling tower 152. The cooling tower 152 can also include a fluid basin 158 configured to contain an amount of cooling fluid (e.g., cooling water) to be provided to a suction of the circulation pump 162. During operation, the cooling fluid return can be sprayed into the cooling tower via the spray manifold 156. Air flowing up by action of the fan 154 can then evaporate a portion of the cooling fluid to reduce a temperature of the cooling fluid. The cooling fluid can then be collected by the fluid basin 158 before being circulated to the air handling units 106 by the circulation pump 162.

FIG. 3B illustrates another example source 150 for providing cooling fluid to the air handling units 106. As shown in FIG. 3B, the example source 150 can be generally similar to that shown in FIG. 3A except the source 150 can include a chiller 164 (e.g., a refrigeration unit) that is configured to further reduce a temperature of the cooling fluid 130 from the fluid basin 158. In yet a further example, the example source 150 shown in FIG. 3C does not include a cooing water tower 122 (FIG. 3B) but instead a fluid reservoir 136 containing the cooling fluid 130 and in fluid communication with the circulation pump 162 and the chiller 164. Though particular examples of the source 150 are shown in FIGS. 3A-3C, in other embodiments, the source 150 can also include valves, swamp coolers, and/or other suitable devices in addition to or in lieu of those shown in FIGS. 3A-3C.

Figure 4A:
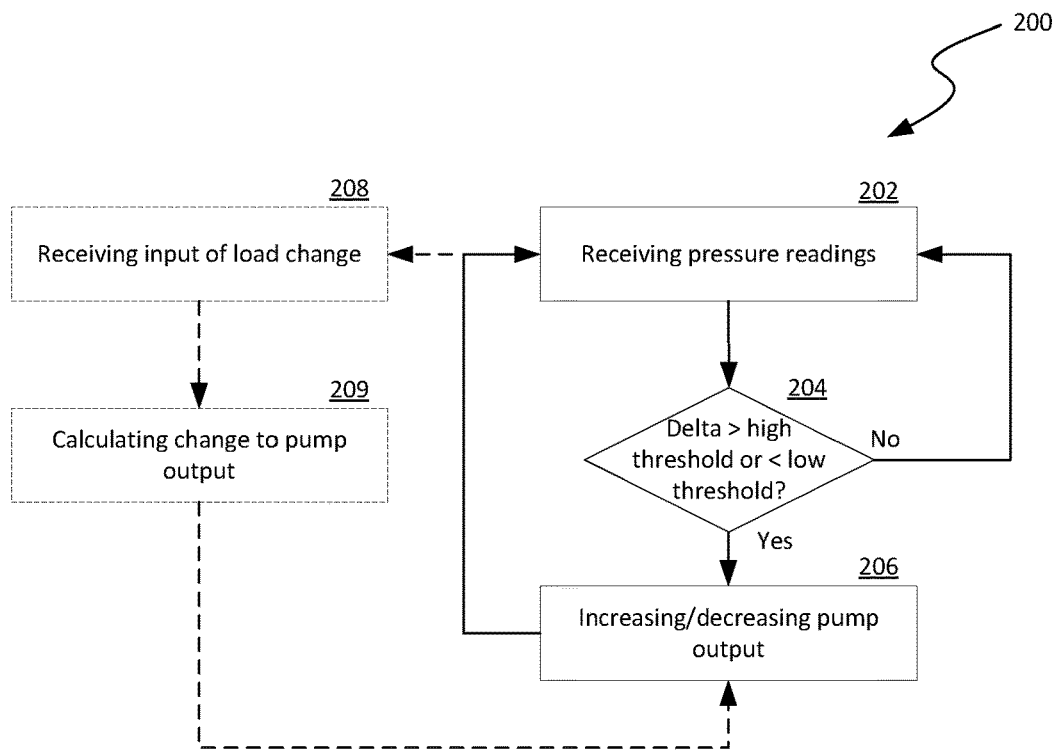
FIGS. 4A and 4B are flowcharts illustrating various processes for automatic tuning of an air-assisted and liquid-cooled cooling system in accordance with embodiments of the disclosed technology.
Figure 4B:
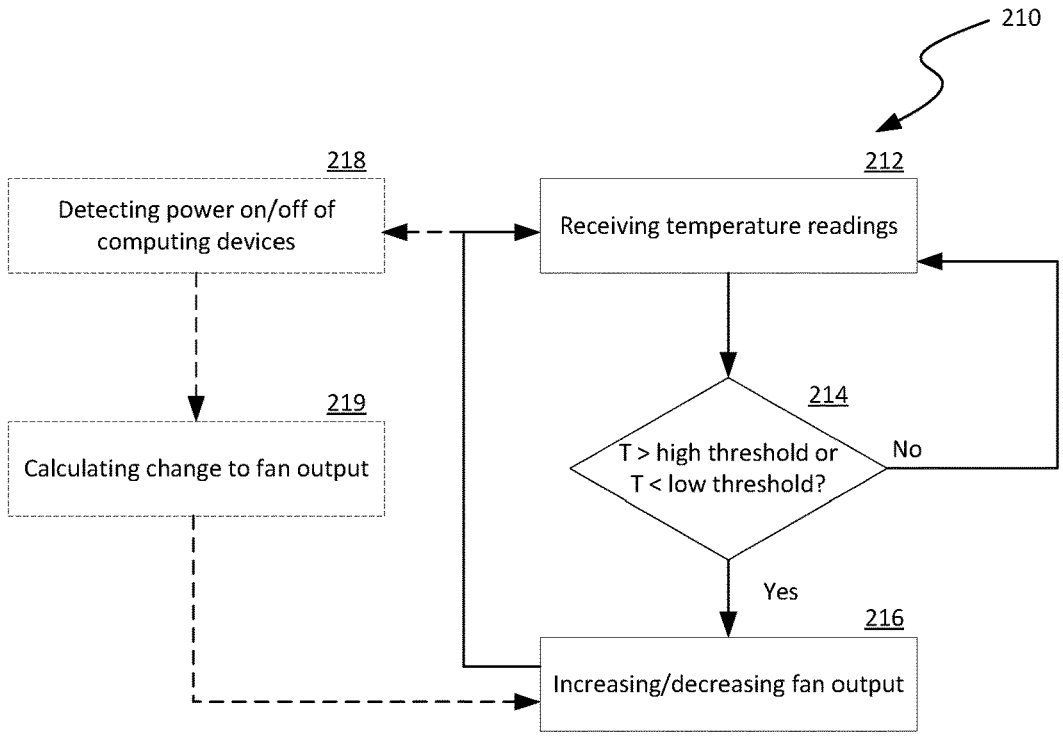

FIGS. 4A and 4B are flowcharts illustrating various processes for automatic tuning of an air-assisted and liquid-cooled cooling system in accordance with embodiments of the disclosed technology. Though embodiments of the processes are described below with reference to the computing facility 100 of FIG. 1, in other embodiments, the processes can also be implemented in other computing facilities with additional and/or different devices.

As shown in FIG. 4A, a process 200 can include receiving pressure readings at stage 202. The pressure readings can include readings of pressure values at the inlet and outlet manifold 108a and 108b in FIG. 1. The process 200 can then include a decision stage 204 to determine whether a difference of the pressure values between the inlet and outlet manifold 108a and 108b exceed a high threshold or below a low threshold. In response to determining that the difference in pressure exceeds the high threshold or below the low threshold, the process 200 can include increasing or decreasing a pump output at stage 206. The process 200 can then revert to receiving additional pressure readings at stage 202.

Optionally, the process 200 can include receiving an input representing a load change for the pump at stage 208. The load change can be an indication that a computing unit 101 (FIG. 1) is added, removed, or replaced in the enclosure 104 (FIG. 1). The process 200 can then include calculating a change to the pump output as a result of the indicated load change at stage 209. Suitable operations of calculating the pump output are described in more detail above with reference to FIGS. 3A-3C. The process 200 can then proceed to increasing/decreasing the pump output based on the calculated change at stage 206.

As shown in FIG. 4B, a process 210 can include receiving temperature readings at stage 212. The temperature readings can be received from temperature sensors configured to detect supply and return temperature values of the coolant 121 at the inlet and/or outlet manifold 108a and 108b, respectively. The process 210 can then include a decision stage to determine whether a temperature reading is above a high threshold or below a low threshold. The temperature reading can be the supply temperature, the return temperature, a difference between the supply and return temperatures, or other suitable combinations thereof. The process 210 can then include increasing or decreasing a fan output in response to that the temperature exceeds the high threshold or below the low threshold at stage 216.

Optionally, the process 200 can include detecting an event indicating a computing unit is powered on or off at stage 218. The event can be detected by monitoring a status of the computing unit via a baseboard controller, a cluster controller, a fabric controller, or other suitable components of the computing facility. The process 200 can then include calculating a change to the fan output as a result of the indicated event at stage 219. Suitable operations of calculating the pump output are described in more detail above with reference to FIGS. 3A-3C. The process 200 can then proceed to increasing/decreasing the fan output based on the calculated change at stage 216.

Figure 5:
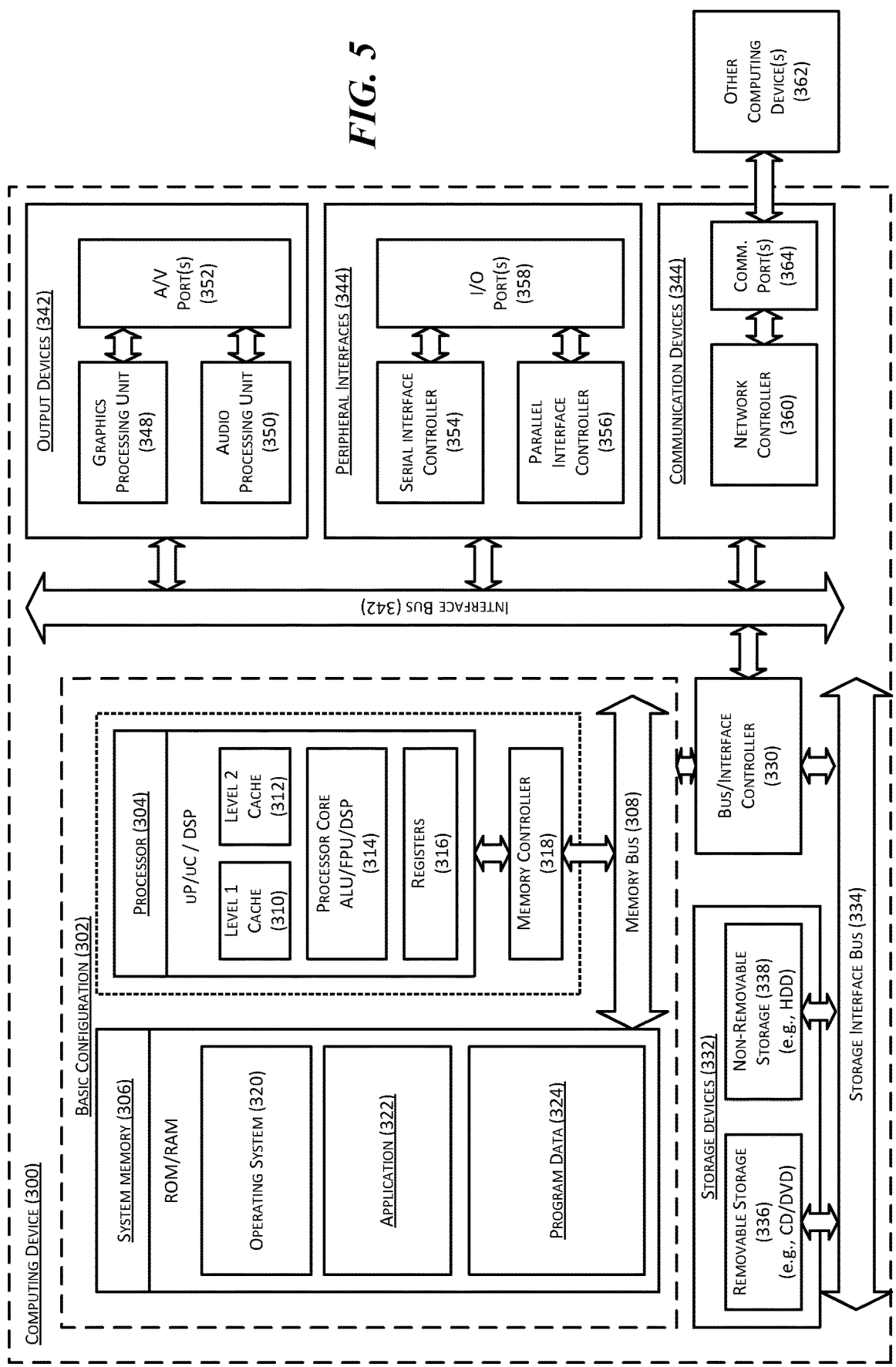
FIG. 5 is a computing device suitable for certain components of the computing facility in FIG. 1.

FIG. 5 is a computing device 300 suitable for certain components of the computing facility 100 in FIG. 1. For example, the computing device 300 can be suitable for the computing units 104 or the controller 130 of FIG. 1. In a very basic configuration 302, the computing device 300 can include one or more processors 304 and a system memory 306. A memory bus 308 can be used for communicating between processor 304 and system memory 306.

Depending on the desired configuration, the processor 304 can be of any type including but not limited to a microprocessor (pP), a microcontroller (pC), a digital signal processor (DSP), or any combination thereof. The processor 304 can include one more level of caching, such as a level-one cache 310 and a level-two cache 312, a processor core 314, and registers 316. An example processor core 314 can include an arithmetic logic unit (ALU), a floating-point unit (FPU), a digital signal processing core (DSP Core), or any combination thereof. An example memory controller 318 can also be used with processor 304, or in some implementations, memory controller 318 can be an internal part of processor 304.

Depending on the desired configuration, the system memory 306 can be of any type including but not limited to volatile memory (such as RAM), non-volatile memory (such as ROM, flash memory, etc.) or any combination thereof. The system memory 306 can include an operating system 320, one or more applications 322, and program data 324. This described basic configuration 302 is illustrated in FIG. 8 by those components within the inner dashed line.

The computing device 300 can have additional features or functionality, and additional interfaces to facilitate communications between basic configuration 302 and any other devices and interfaces. For example, a bus/interface controller 330 can be used to facilitate communications between the basic configuration 302 and one or more data storage devices 332 via a storage interface bus 334. The data storage devices 332 can be removable storage devices 336, non-removable storage devices 338, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data. The term "computer readable storage media" or "computer readable storage device" excludes propagated signals and communication media.

The system memory 306, removable storage devices 336, and non-removable storage devices 338 are examples of computer readable storage media. Computer readable storage media include, but not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other media which can be used to store the desired information, and which can be accessed by computing device 300. Any such computer readable storage media can be a part of computing device 300. The term "computer readable storage medium" excludes propagated signals and communication media.

The computing device 300 can also include an interface bus 340 for facilitating communication from various interface devices (e.g., output devices 342, peripheral interfaces 344, and communication devices 346) to the basic configuration 302 via bus/interface controller 330. Example output devices 342 include a graphics processing unit 348 and an audio processing unit 350, which can be configured to communicate to various external devices such as a display or speakers via one or more NV ports 352. Example peripheral interfaces 344 include a serial interface controller 354 or a parallel interface controller 356, which can be configured to communicate with external devices such as input devices (e.g., keyboard, mouse, pen, voice input device, touch input device, etc.) or other peripheral devices (e.g., printer, scanner, etc.) via one or more I/O ports 358. An example communication device 346 includes a network controller 360, which can be arranged to facilitate communications with one or more other computing devices 362 over a network communication link via one or more communication ports 364.

The network communication link can be one example of a communication media. Communication media can typically be embodied by computer readable instructions, data structures, program modules, or other data in a modulated data signal, such as a carrier wave or other transport mechanism, and can include any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), microwave, infrared (IR) and other wireless media. The term computer readable media as used herein can include both storage media and communication media.

The computing device 300 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. The computing device 300 can also be implemented as a personal computer including both laptop computer and non-laptop computer configurations.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method of cooling multiple servers housed in an enclosure in a computing facility, the enclosure including:
   an internal space housing the multiple servers, an air inlet opposite an air outlet separated from each other by the internal space; and
   a cooling system having:
      an inlet manifold configured to provide a coolant to one or more computing units of the multiple servers;
      an outlet manifold configured to collect the coolant flowing from the inlet manifold and past the one or more computing units of the multiple servers;
      a heat exchanger configured to receive the coolant collected at the outlet manifold;
      an air mover configured to force at least a portion of cooling air flowing from the air inlet of the enclosure toward the heat exchanger before exhausting via the air outlet of the enclosure;
      a coolant reservoir containing the coolant; and
      a plurality of pumps arranged in parallel, the plurality of pumps operatively in fluid communication with the coolant reservoir and the inlet manifold, the plurality of pumps being configured to move the coolant from the coolant reservoir to the inlet manifold; and
   wherein the method includes:
      detecting a pressure drop of the coolant flowing across the multiple servers between the inlet and outlet manifolds;
      performing a comparison of the detected pressure drop to a setpoint;
      automatically adjusting operations of the plurality of pumps in the cooling system in accordance with the performed comparison such that additional detected pressure drops are at or near the setpoint, wherein automatically adjusting operations of the plurality of pumps including turning on or turning off one of the plurality of pumps based on the performed comparison; and
      wherein automatically adjusting operations of the plurality of pumps includes turning off one of the plurality of pumps when the detected pressure drop is below the setpoint.

2. The method of claim 1, further comprising:
   detecting a supply temperature of the coolant provided to the multiple servers at the inlet manifold;
   performing a comparison of the detected supply temperature of the coolant to a setpoint; and
   automatically adjusting operations of the air mover in the cooling system in accordance with the performed comparison such that additional detected supply temperatures of the coolant are at or near the setpoint.

3. The method of claim 2 wherein automatically adjusting operations of the air mover includes one or more of:
   increasing a speed of the air mover when the detected supply temperature exceeds the setpoint;
   decreasing the speed of the air mover when the detected supply temperature is below the setpoint; or
   turning on an additional air mover in the cooling system when the detected supply temperature exceeds the setpoint.

4. The method of claim 2, further comprising:
   receiving an input indicating an addition, removal, or replacement of a server in the enclosure; and
   upon receiving the input,
      determining an expected change to the supply temperature of the coolant at the inlet manifold based on a heat generation characteristic of the server; and
      automatically adjusting operations of the air mover using the determined expected change to the detected supply temperature in addition to the performed comparison.

5. The method of claim 1 wherein automatically adjusting operations of the plurality of pumps includes:
   increasing a speed of one of the plurality of pumps when the detected pressure drop exceeds the setpoint;
   determining whether the increased speed of the one of the plurality of pumps exceeds a threshold; and
   in response to determining that the increased speed of the one of the plurality of pumps exceeds the threshold, turning on another one of the plurality of pumps.

6. The method of claim 1 wherein automatically adjusting operations of the plurality of pumps includes:
   decreasing a speed of one of the plurality of pumps when the detected pressure drop is below the setpoint;
   determining whether the decreased speed of the one of the plurality of pumps is below a threshold; and
   in response to determining that the decreased speed of the one of the plurality of pumps is below the threshold, turning off the one of the plurality of pumps.

7. The method of claim 1, further comprising:
   receiving an input indicating an addition, removal, or replacement of a server in the enclosure; and
   upon receiving the input,
      determining an expected change to the detected pressure drop based on a flow characteristic of the addition, removal, or replacement of the server; and
      automatically adjusting operations of the pump using the determined expected change to the detected pressure drop in addition to the performed comparison.

8. The method of claim 1, wherein automatically adjusting operations of the plurality of pumps includes turning on the one of the plurality of pumps when the detected pressure drop exceeds a threshold.

9. A method of cooling multiple servers housed in an enclosure in a computing facility, the enclosure including:
an internal space housing the multiple servers, an air inlet opposite an air outlet separated from each other by the internal space; and
a cooling system having
an inlet manifold configured to provide a coolant to the multiple servers;
an outlet manifold configured to collect the coolant flowing from the inlet manifold and past the multiple servers;
a heat exchanger configured to receive the coolant collected at the outlet manifold;
an air mover configured to force at least a portion of cooling air flowing from the air inlet of the enclosure toward the heat exchanger before exhausting via the air outlet of the enclosure;
a coolant reservoir containing the coolant; and
a pump operatively in fluid communication with the coolant reservoir and the inlet manifold, the pump being configured to move the coolant from the coolant reservoir to the inlet manifold; and
wherein the method includes:
detecting a pressure drop of the coolant flowing across the multiple servers between the inlet and outlet manifolds;
performing a comparison of the detected pressure drop to a setpoint; and
automatically adjusting operations of the pump in the cooling system in accordance with the performed comparison such that additional detected pressure drops are at or near the setpoint, automatically adjusting the operations including one or more of:
increasing a speed of the pump when the detected pressure drop exceeds the setpoint;
decreasing the speed of the pump when the detected pressure drop is below the setpoint; or
turning on an additional pump arranged in parallel with the pump and in fluid communication with the coolant reservoir when the detected pressure drop exceeds the setpoint.

10. The method of claim 9 wherein automatically adjusting operations of the pump includes automatically adjusting operations of the air mover including one or more of:
increasing a speed of the air mover when a detected supply temperature exceeds a temperature setpoint;
decreasing the speed of the air mover when the detected supply temperature is below the temperature setpoint; or
turning on an additional air mover in the cooling system when the detected supply temperature exceeds the temperature setpoint.

11. The method of claim 9 further comprising:
receiving an input indicating an addition, removal, or replacement of a server in the enclosure; and
upon receiving the input,
determining an expected change to a supply temperature of the coolant at the inlet manifold based on a heat generation characteristic of the server; and
automatically adjusting operations of the air mover using the expected change to the supply temperature.

12. The method of claim 9 further comprising:
receiving an input indicating an addition, removal, or replacement of a server in the enclosure; and
upon receiving the input,
determining an expected change to the detected pressure drop based on a flow characteristic of the addition, removal, or replacement of the server; and
automatically adjusting operations of the pump using the determined expected change to the detected pressure drop.

13. The method of claim 9, wherein automatically adjusting operation of the pump includes turning on the pump when the detected pressure drop exceeds a threshold.

14. A method of cooling multiple servers housed in an enclosure in a computing facility, the enclosure including:
an internal space housing the multiple servers, an air inlet opposite an air outlet separated from each other by the internal space; and
a cooling system having
an inlet manifold configured to provide a supply coolant to one or more computing units of the multiple servers;
an outlet manifold configured to collect a return coolant flowing from the inlet manifold and past the one or more computing units of the multiple servers, wherein the supply coolant removes heat from the multiple servers such that the return coolant is a higher temperature than the supply coolant;
an air-cooled heat exchanger configured to receive the return coolant collected at the outlet manifold;
an air mover configured to force at least a portion of cooling air flowing from the air inlet of the enclosure toward the heat exchanger before exhausting via the air outlet of the enclosure;
a coolant reservoir containing the supply coolant; and
a plurality of pumps arranged in parallel, the plurality of pumps operatively in fluid communication with the coolant reservoir and the inlet manifold, the plurality of pumps being configured to move the supply coolant from the coolant reservoir to the inlet manifold; and
wherein the method includes:
detecting a pressure drop of the supply coolant flowing across the multiple servers between the inlet and outlet manifolds and a supply temperature of the supply coolant at the inlet manifold; and
automatically adjust operations of the plurality of pumps to maintain the detected pressure drop at or near a pressure-drop setpoint while automatically adjusting operations of the air mover to maintain the supply temperature at or near a temperature setpoint, wherein automatically adjusting operations of the plurality of pumps including turning on or turning off one of the plurality of pumps based on a performed comparison of the detected pressure drop to the pressure-drop setpoint; and
wherein automatically adjusting operations of the plurality of pumps includes:
increasing a speed of one of the plurality of pumps when the detected pressure drop exceeds the pressure-drop setpoint;
determining whether the increased speed of the one of the plurality of pumps exceeds a threshold; and
in response to determining that the increased speed of the one of the plurality of pumps exceeds the threshold, turning on another one of the plurality of pumps.

15. The method of claim 14 wherein automatically adjusting operations of the air mover includes one or more of:
- increasing a speed of the air mover when the detected supply temperature exceeds the temperature setpoint;
- decreasing the speed of the air mover when the detected supply temperature is below the temperature setpoint; or
- turning on an additional air mover in the cooling system when the detected supply temperature exceeds the temperature setpoint.

16. The method of claim 14 wherein automatically adjusting operations of the plurality of pumps includes one or more of:
- increasing a speed of one of the plurality of pumps when the detected pressure drop exceeds the pressure-drop setpoint;
- decreasing the speed of one of the plurality of pumps when the detected pressure drop is below the pressure-drop setpoint; or
- turning on an additional pump of the plurality of pumps when the detected pressure drop exceeds the pressure-drop setpoint.

17. The method of claim 14 wherein automatically adjusting operations of the plurality of pumps includes turning off one of the plurality of pumps when the detected pressure drop is below the pressure-drop setpoint.

18. The method of claim 14, wherein automatically adjusting operations of the plurality of pumps includes turning on the one of the plurality of pumps when the detected pressure drop exceeds a threshold.

\* \* \* \* \*